United States Patent
Hopkins et al.

(10) Patent No.: US 6,560,556 B1
(45) Date of Patent: May 6, 2003

(54) NON-INVASIVE PROCESS FOR CIRCUIT DEFECT ISOLATION USING THERMAL EXPANSION PROPERTY OF THERMODYNAMICS

(75) Inventors: Kenneth Marshall Hopkins, Round Rock, TX (US); David Raymond Posh, Cedar Park, TX (US); Kurt Russell Taylor, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/451,957

(22) Filed: Nov. 30, 1999

(51) Int. Cl.⁷ .............................................. G01R 31/02
(52) U.S. Cl. ........................ 702/121; 702/65; 702/58; 702/59; 324/537
(58) Field of Search ............................. 702/59, 65, 34, 702/35, 81, 82, 83, 84, 58, 121, 33, 36, 37, 108, 117, 118, 127, 133, 136, 183–185, 188, FOR 103, FOR 104, FOR 105, FOR 123–FOR 125, FOR 137, FOR 139, FOR 141, FOR 155, FOR 170, FOR 171; 324/512, 752, 73.1; 374/29, 30

(56) References Cited

U.S. PATENT DOCUMENTS

| | | | |
|---|---|---|---|
| 3,602,041 A | * 8/1971 | Wienert | 73/116 |
| 5,162,742 A | * 11/1992 | Atkins | 324/523 |
| 5,309,108 A | 5/1994 | Maeda et al. | 324/501 |
| 5,489,851 A | * 2/1996 | Heumann | 348/744 |
| 5,532,600 A | * 7/1996 | Hoshino | 324/537 |
| 5,640,099 A | 6/1997 | Sanada | 324/752 |
| 5,742,177 A | * 4/1998 | Kalb, Jr. | 324/522 |
| 5,758,970 A | * 6/1998 | Aubert | 324/715 |
| 6,086,294 A | * 7/2000 | Danchine | 409/132 |
| 6,236,196 B1 | * 5/2001 | Guidotti | 324/73.1 |
| 6,242,923 B1 | * 6/2001 | Scaman | 324/529 |

* cited by examiner

Primary Examiner—Hal Wachsman
(74) Attorney, Agent, or Firm—Duke W. Yee; David A. Mims, Jr.; Lisa L. B. Yociss

(57) ABSTRACT

A method and apparatus for detecting and locating a circuit defect. In a preferred embodiment, the apparatus includes a resistance measuring device for measuring the resistance of the circuit, a heat source, and a recorder. The heat source is placed near the surface of the circuit but is not placed in physical contact with the surface. The heat source is moved about to a plurality of points in a plane parallel to and above the surface of the circuit while the resistance of the circuit is measured when the heat source is at each of the points. The recorder is functionally connected to the resistance measuring device and to the heat source, and determines and records the horizontal location of the heat source and records the resistance of the circuit at each of these locations.

36 Claims, 2 Drawing Sheets

NON-INVASIVE PROCESS FOR CIRCUIT DEFECT ISOLATION USING THERMAL EXPANSION PROPERTY OF THERMODYNAMICS

BACKGROUND OF THE INVENTION

1. Technical Field

The present invention relates to electric circuits and, more particularly, to a method and apparatus for detecting and locating circuit defects.

2. Description of Related Art

In a test process of the manufacturing processes of a large scale integrated (LSI) circuit, it is difficult to detect a short circuit point. Specifically, in a case of completion of an LSI circuit such as an application specific integrated circuit (ASIC) ordered by a user for delivery within a short period of time, a short circuit problem sometimes occurs. A short circuit is typically formed between a plurality of power supply wiring patterns because there are crosses between power supply wiring patterns and because bugs of wiring design data, error in setting the coordinates of wiring patterns, or overlapping wiring patterns are occasionally introduced in the computer aided design (CAD) process. Such a type of short circuit between the power supply wiring patterns is the cause of incomplete operation of logic circuits as a main functional circuit of the ASIC.

In highly integrated circuits, it is very difficult to detect a point where the short circuit is formed. Conventionally, there is a method of visually checking the wiring mask pattern as a method of detecting a short circuit point between wiring patterns. However, it is impossible to completely check the wiring mask pattern for a large scaled integrated (VLSI) circuit layout.

A more sophisticated method of detecting circuit defects uses a combination of heat and voltage injection. These methods allow detection of circuit defects that are not observable visually. These methods involve heating the entire circuit assembly and then cooling sections of the assembly with compressed gas or liquid to locate probable defective components. However, subjecting electronic components to this rapid temperature change introduces structural damage to the components and, ultimately, causes degradation or failure of the component under normal operating conditions. Furthermore, the machines needed to perform this method are very costly and complicated to use. Therefore, a method and apparatus that allows detection and location of defects within a circuit to ensure the highest confidence in the integrity of the component assembly being repaired which does not damage the circuitry and that maintains lower production costs is desirable.

SUMMARY OF THE INVENTION

The present invention provides a method and apparatus for detecting and locating a circuit defect. In a preferred embodiment, the apparatus includes a resistance measuring device for measuring the resistance of the circuit, a heat source, and a recorder. The heat source is placed near the surface of the circuit but is not placed in physical contact with the surface. The heat source is moved about to a plurality of points in a plane parallel to and above the surface of the circuit while the resistance of the circuit is measured when the heat source is at each of the points. The recorder is functionally connected to the resistance measuring device and to the heat source, and determines and records the horizontal location of the heat source and records the resistance of the circuit at each of these locations.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
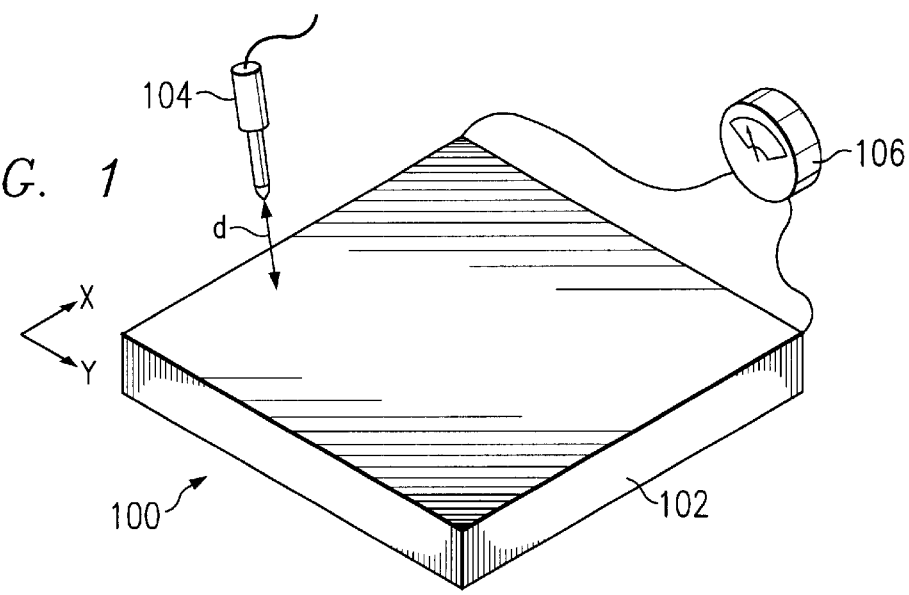
FIG. 1 depicts a pictorial diagram of a circuit defect location determining system in accordance with the present invention.

With reference now to the Figures and, in particular, with reference to FIG. 1, a pictorial diagram illustrating a circuit defect location determining system is depicted in accordance with the present invention. Circuit defect location system 100 includes a heat source 104, such as, for example, a soldering iron or a forced air heat gun, and a resistance measuring device 106, such as, for example, an ohmmeter. System 100 is used to determine the general area within a defective circuit 102 in which the defective component is contained.

Resistance measuring device 106 is connected to circuit 102 such that the resistance of the entire circuit can be measured. The Thermal Expansion Property of Thermodynamics says that as heat is applied to a consistent mass, the resistance of that mass changes in a consistent manner. Therefore, there is a high probability that a defect in the planar circuit assembly or semiconductor does not have the same mass as the circuits to which it is connected. Thus, while resistance measuring device 106 monitors the resistance of circuit 102, heat source 104 is moved around the x-y plane at a constant distance d above the surface of circuit 102. Heat source 104 is never placed into physical contact with any of the components of circuit 102 in this first stage of determining the general area in which the defective circuit is located. Heat from heat source 104 is transferred to circuit 102 inducing thermal ramping of the components within the general area beneath heat source 104. Once heat source 104 is above the general area in which the defective component or circuit is contained within circuit 102, the resistance as measured by device 106 will show a dramatic change. The change in resistance may be up or down depending on whether the defective mass is being compressed or elongated during thermal ramping.

The temperatures of heat source 104 depend on the requirements of the specific circuit 102 being tested for circuit defect isolation. However, traditionally, all of the components in typical circuit designs are able to withstand thermal ramping from ambient room temperature to +300 degrees Celsius when initial vapor soldering occurs. In a vapor soldering process, a solder paste is applied to the circuit board and the components placed in the paste. The entire assemble is then lowered into a chamber containing a "liquid" that has been heated into its vapor state. The thermal ramping that occurs to the circuit board once lowered into the chamber is virtually immediate, which then melts the solder/flux compound to solder the components into place. By using a radiant heat source, the possibility of thermal ramping that would exceed the specification for any given component of the circuit board can be dramatically reduced.

In practice, consistent results have been obtained when the heat transferred to the component is between 200 and 300 degrees Celsius. As little as 150 degrees Celsius may be all that is required to invoke a resistive change. However, the faster the heat transfer, the more dramatic the resulting change in the resistance of the circuit.

The distance d that heat source 104 is placed away from circuit 102 varies depending on the heat source utilized and the tolerances of the particular circuit 102 for which a circuit defect must be isolated. Heat source 104 must be close enough to the surface of circuit 102 to have a heat transfer from heat source 104 to circuit 102 without exceeding the material's heat tolerance. In practice, using soldering iron as the heat source, an appropriate distance d which produced good results was a value of one half inch.

The amount of time for the appropriate amount of thermal ramping to occur can be determined by placing the chosen heat source in proximity to a thermometer to gauge the time required for thermal ramping. This time frame will be determined based on the operator's available heat source and the minimum and maximum heat specifications of the individual components in the assembly being tested.

Figure 2:
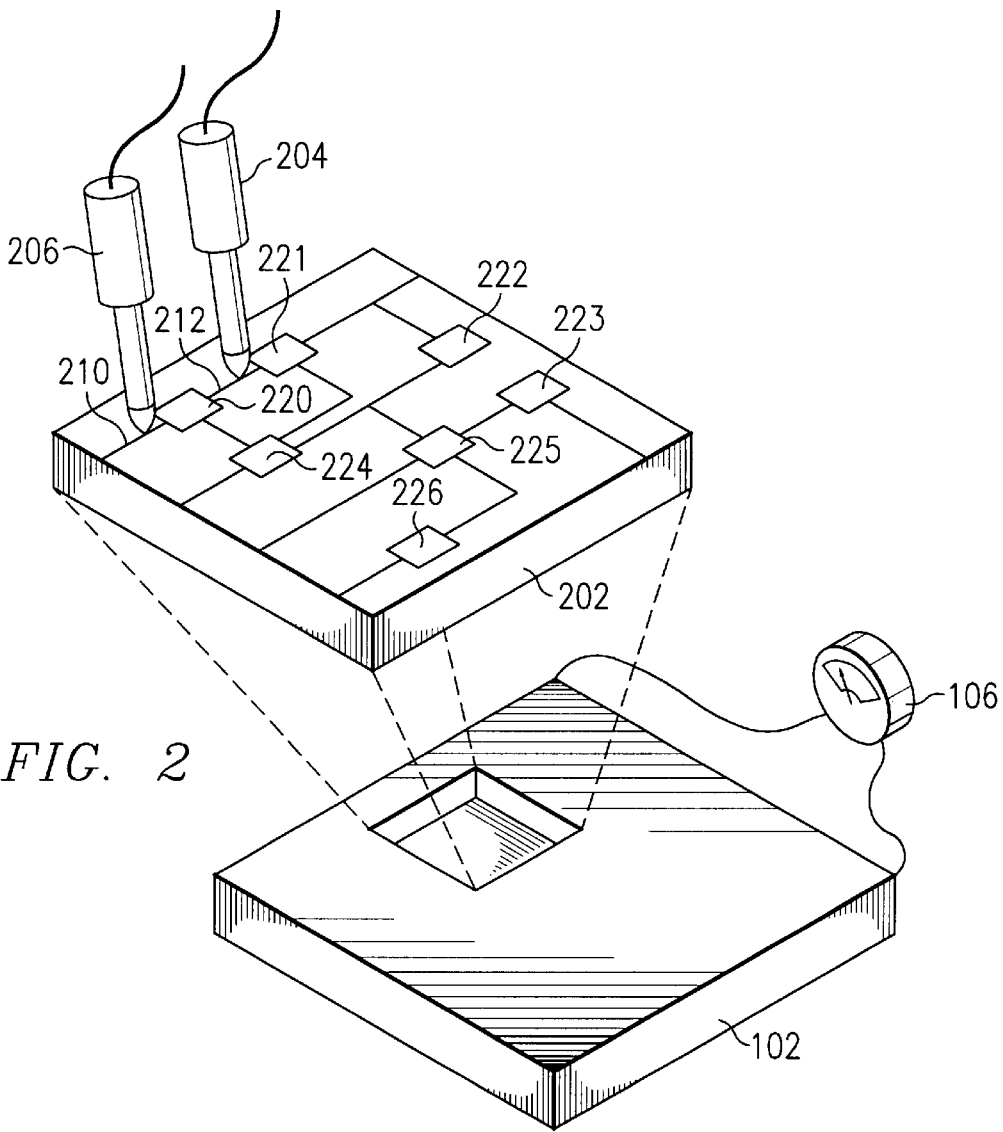
FIG. 2 depicts a pictorial diagram of a circuit defect isolation determining system for specifying specific defective circuits within the assembly in accordance with the present invention.

Referring now to FIG. 2, a pictorial diagram illustrating a circuit defect isolation determining system for specifying specific defective circuits within the assembly is depicted in accordance with the present invention. Once the general area 202 of circuit 102 in which the defective component resides is determined, heat sources 204 and 206 are used to determine the specific component within the circuit assembly 102 that is defective. Heat sources 204 and 206 are placed into physical contact with the leads of suspect components 220–226 within area 202. The resistance of the entire circuit is measured by device 106 as the leads of each individual suspect component 220–226 are placed into physical contact with heat sources 204 and 206. The resistance of circuit 102 will show a dramatic change as heat sources 204 and 206 are placed into physical contact with the leads 210 and 212 of the defective component 220.

If the suspect component within area 202 is a multi-lead component with more than two leads, then more than two heat sources 204 and 206 will be required, since each lead must be in physical contact with a heat source.

The present invention may be implemented by a repair technician utilizing tools commonly available to a repair technician including a soldering iron or forced air heat gun for a heat source and an ohmmeter or digital multimeter. The processes of the present invention are relatively simple and would require a minimum amount of training to allow a technician to implement them. Furthermore, by using a localized heat source to minimize thermal ramping, the problem component within the circuit may be located without compromising the integrity of the component circuit assembly.

Figure 3:
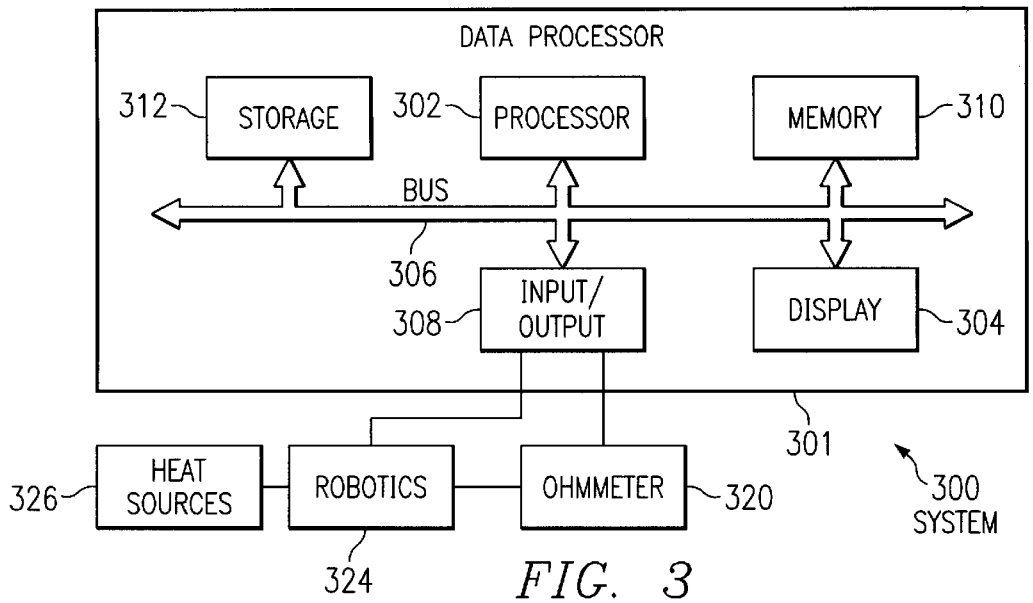
FIG. 3 depicts a block diagram of an automative system for testing defective circuits in accordance with the present invention.

Referring now to FIG. 3, a block diagram of an automative system for testing defective circuits is depicted in accordance with the present invention. Defective circuit location system 300 includes a data processor 301, an ohmmeter 320, robotics system 324, and heat sources 326.

Data processing system 301 includes storage unit 312, processor 302, memory unit 310, input/output unit 308, and display 304. Each of units 302, 304, 308, 310, and 312 is connected to bus 306 which couples the various component units to each other. Processor 302 executes instructions that have been loaded into memory 310, which controls the operations of robotics system 324, determines the temperature of heat sources 326, and correlates the resistance of a defective circuit as measured by ohmmeter 320 to the position of the heat sources 326. Correlated data may be stored in storage unit 312 for further processing or viewing at a later time or may be displayed to a user via display 304.

Connection from data processing system 301 to robotics system 324 and to ohmmeter 320 is provided by input/output unit 308. Robotics system 324 is connected to heat sources 326, which may comprise one or more heat sources such as, for example, heat sources 104, 204, or 206, and is also connected to the leads of ohmmeter 320. Robotics system 324 includes mechanisms and electronics for controlling the movement and placement of heat sources 326 and the leads from ohmmeter 320.

Robotics system 324 controls movement and/or placement of the two leads from ohmmeter 320 such that one lead is placed in physical contact with an input lead to a defective circuit and one lead is placed in physical contact with an output lead to the defective circuit such that the resistance of the circuit can be measured by ohmmeter 320 and such resistance measurement sent to data processing system 301.

Robotics system 324, under the control of data processing system 301, moves heat sources 326 around in a plane above the surface of the defective circuit to determine the general area of the defective component within the defective circuit as described in more detail above. Once the general area of the defective component within the defective circuit has been found, robotics system 324 places various parts or ones of heat sources 326 into physical contact with the leads of each of several components within the general area in which the defective component is located successively while the resistance of the circuit is being monitored by data processing system 301. Thus, the particular defective component within the circuit may be isolated.

Input/output unit 308 may also be coupled to a keyboard, mouse or other user input device to allow a user to control some or all of the process and to allow the user to selectively view the data in various formats.

Although the automated circuit defect isolation and location system 300 in FIG. 3 has been described primarily with reference to an ohmmeter, other devices for measuring the resistance of the defective circuit may be used as well. Furthermore, system 300 is an example of an automative circuit defect isolation and location system and is not meant to imply any architectural limitations to the present invention.

Figure 4:
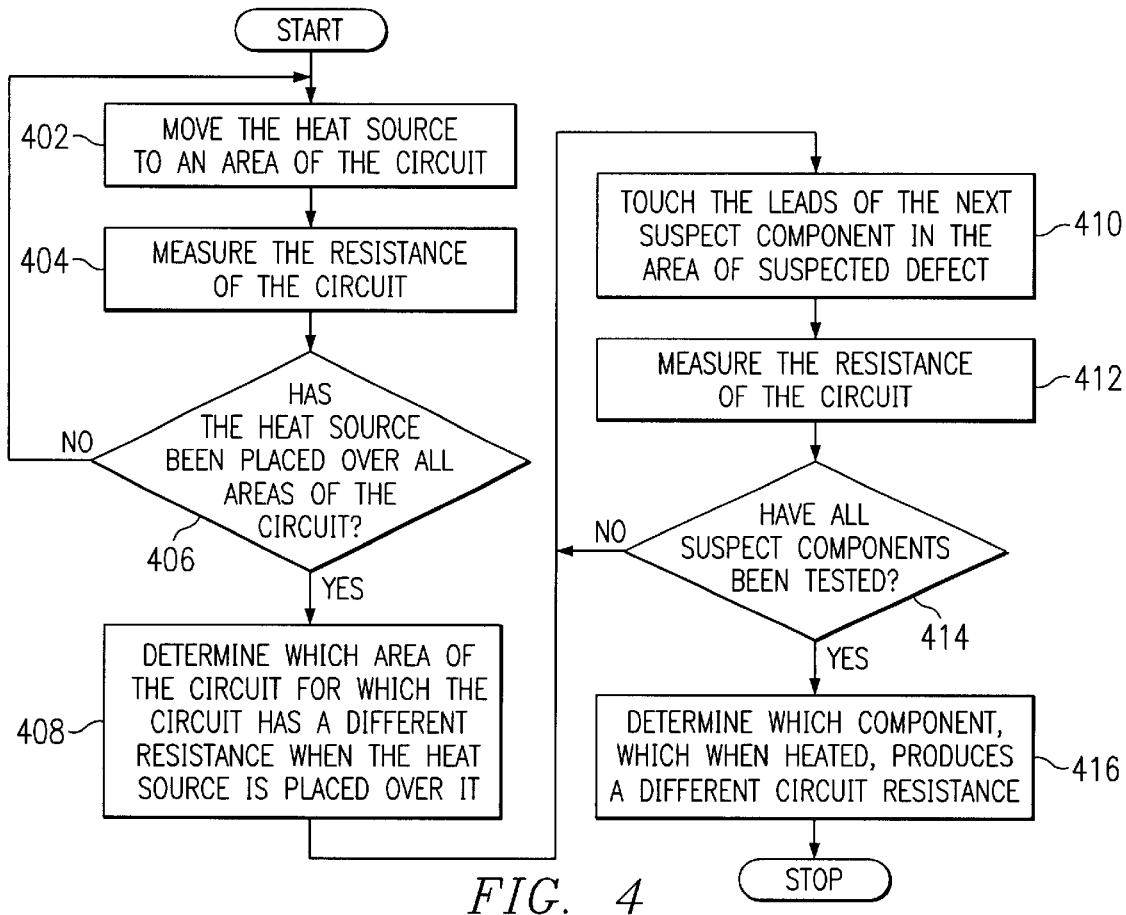
FIG. 4 depicts a flowchart of a preferred method of locating circuit defects in accordance with the present invention.

Referring now to FIG. 4, a flowchart illustrating a preferred method of locating circuit defects is depicted in accordance with the present invention. First, a heat source is placed over the surface of a circuit for which the location of a defect must be determined (step 402). The heat source is placed near the surface, but not in physical contact with the surface of the circuit. Preferably, the heat source is placed approximately one half inch away from the surface of the circuit. Next, the resistance of the circuit is measured with the heat source at the current point (step 404). Next, it is determined whether the heat source has been placed over all areas of the surface of the circuit and that the resistance of the circuit has been measured for the heat source in each location (step 406). If all areas of the surface of the circuit have not been covered, then the heat source is moved to be above a new area of the surface of the circuit (step 402) and the resistance of the circuit with the heat source over this new area of the surface of the circuit is determined (step 404).

This process continues with the heat source systematically moved around the surface of the circuit until the resistance of the circuit has been measured for all placements of the heat source. The process can be a continuous process with the resistance measured continuously while the heat source moves around the surface of the circuit. Alternatively, the process can be a discrete process in which the heat source is placed over a discrete set of points which are evenly distributed over the surface of the circuit and the resistance measured with the heat source located at each of the discrete set of points. Although described as taking individual resistance measurements, in practice, it is more likely that the resistance is constantly monitored for a dramatic change.

Once it is determined that the heat source has been placed generally over all areas of the circuit and the corresponding resistance of the circuit measured, then the general area of the circuit that contains the circuit defect is determined (step 408). The general area of the circuit in which the circuit defect is contained is the area of the circuit in which the measured resistance of the circuit, with the heat source placed over this area, varied significantly as compared to the measured resistances of the circuit with the heat source placed over other areas of the circuit.

Once the general area of the circuit in which the circuit defect is located is determined, then a heat source is placed in physical contact with the leads of a first suspect component within the defect area (step 410) and the resistance of the circuit measured (step 412). Next, it is determined whether all components within the suspect area have been tested (i.e. had their resistances measured when their leads are in physical contact with a heat source) (step 414). If all components within the suspect area have not been tested, then the heat source is placed in physical contact with the leads of the next untested component within the suspect area (step 410) and the resistance of the circuit measured (step 412).

Once all suspect components have been tested, then the component or components which are defective are determined (step 416). This determination is made by comparing the measured circuit resistances to each other. The component whose leads were physically in contact with the heat source for the resistance measurement that was significantly different from the other resistance measurements is the defective component.

It is important to note that while the present invention has been described in the context of a fully functioning data processing system, those of ordinary skill in the art will appreciate that the processes of the present invention are capable of being distributed in form of a computer readable medium of instructions and a variety of forms and that the present invention applies equally regardless of the particular type of signal bearing media actually used to carry out the distribution. Examples of computer readable media include recordable-type media such a floppy disc, a hard disk drive, a RAM, and CD-ROMs and transmission-type media such as digital and analog communications links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application and to enable others of ordinary skill in the art to understand the invention for various embodiments with various modifications as are suited to the particular use contemplated.

What is claimed is:

1. A circuit defect detection and location apparatus, comprising:

a resistance measuring device for measuring the resistance of a circuit;

a first heat source, wherein the first heat source is placed proximate to a surface of the circuit but does not contact the surface and wherein the first heat source moves about in a plane parallel to and above the surface of the circuit;

a recorder functionally connected to the resistance measuring device and the first heat source, wherein the recorder determines and records the horizontal location of the first heat source and records the resistance of the circuit as a function of the location of the first heat source;

said first heat source for identifying a generalized defective area of said circuit, said generalized defective area including a plurality of components;

a second heat source for physically contacting only the leads of said plurality of components in response to said identification of a generalized defective area of said circuit utilizing said first heat source; and said second heat source for identifying defective ones of said plurality of components.

2. The circuit defect detection and location apparatus as recited in claim 1, wherein the first heat source and the second heat source are the same heat source.

3. The circuit defect detection and location apparatus as recited in claim 1, wherein the second heat source is a soldering iron tip.

4. The circuit defect detection and location apparatus as recited in claim 1, wherein the resistance measuring device is an ohmmeter.

5. The circuit defect detection and location apparatus as recited in claim 1, wherein the location of a circuit defect is determined from the location of the first heat source for which a circuit resistance is measured that is significantly different from a circuit resistance that is measured for other locations of the first heat source.

6. The circuit defect detection and location apparatus as recited in claim 1, wherein thermal ramping of the circuit is minimized.

7. The circuit defect detection and location apparatus as recited in claim 1, wherein the circuit is undamaged after the circuit defect location is performed.

8. The circuit defect detection and location apparatus as recited in claim 1, wherein the first heat source is placed approximately one half inch above the surface of the circuit.

9. A method of detecting and locating a circuit defect, comprising the steps of:

placing a first heat source proximate to a surface of a circuit;

moving the first heat source horizontally in a plane parallel to the surface of the circuit so that the first heat source is placed above different areas of the surface of the circuit;

measuring a plurality of resistances of the circuit wherein each resistance of the plurality of resistances corresponds to a different horizontal location of the first heat source from a plurality of horizontal locations of the first heat source;

comparing each resistance of the plurality of resistances to identify at least one area of said different areas of the surface that includes at least one circuit defect, said at least one area of said different areas including a plurality of components;

physically contacting a second heat source to only the leads of said plurality of components while simultaneously measuring the resistance of the circuit;

comparing each resistance of the plurality of resistances that were measured when the second heat source was physically contacting the leads of said plurality of components to identify at least one component of said plurality of components.

10. The method as recited in claim 9, wherein the first heat source and the second heat source are the same.

11. The method as recited in claim 9, wherein the location of the circuit defect is determined from the horizontal location of the first heat source for which the corresponding measured resistance of the circuit is significantly different from the resistance of the circuit as measured at all other horizontal locations of the first heat source.

12. The method as recited in claim 9, wherein the second heat source is a soldering iron tip.

13. The method as recited in claim 9, wherein the resistance of the circuit is measured with an ohmmeter.

14. The method as recited in claim 9, wherein the first heat source is placed approximately one half inch above the surface of the circuit.

15. The method as recited in claim 9, wherein the circuit is not subjected to rapid temperature change.

16. The method as recited in claim 9, wherein the circuit is undamaged after the location of the circuit defect is determined.

17. A system of detecting and locating a circuit defect, comprising:

means for placing a first heat source proximate to a surface of a circuit;

means for moving the first heat source horizontally in a plane parallel to the surface of the circuit so that the first heat source is placed above different areas of the surface of the circuit;

means for measuring a plurality of resistances of the circuit wherein each resistance of the plurality of resistances corresponds to a different horizontal location of the first beat source from a plurality of horizontal locations of the first heat source;

means for comparing each resistance of the plurality of resistances to identify at least one area of said different areas of the surface that includes at least one circuit defect, said at least one area of said different areas including a plurality of components;

physically contacting a second heat source to leads of said plurality of component while simultaneously measuring the resistance of the circuit; and comparing each resistance of the plurality of resistances that were measured when the second heat source was physically contacting only the leads of said plurality of components to identify at least one component of said plurality of components.

18. The system as recited in claim 17, wherein the first heat source and the second heat source are the same.

19. The system as recited in claim 17, wherein the location of the circuit defect is determined from the horizontal location of the first heat source for which the corresponding measured resistance of the circuit is significantly different from the resistance of the circuit as measured at all other horizontal locations of the first heat source.

20. The system as recited in claim 17, wherein the second heat source is a soldering iron tip.

21. The system as recited in claim 17, wherein the resistance of the circuit is measured with an ohmmeter.

22. The system as recited in claim 17, wherein the first heat source is placed approximately one half inch above the surface of the circuit.

23. The system as recited in claim 17, wherein the circuit is not subjected to rapid temperature change.

24. The system as recited in claim 17, wherein the circuit is undamaged after the location of the circuit defect is determined.

25. A computer program product in a computer readable media for use in a data processing system for detecting and locating a circuit defect, comprising:

first instructions for controlling a robotic system in order to place a first heat source proximate to a surface of a circuit and to place leads of a resistance measuring device into physical contact with leads of the circuit;

second instructions for controlling the robotic system such that the first heat source is moved horizontally in a plane parallel to the surface of the circuit so that the first heat source is placed above different areas of the surface of the circuit;

third instructions for measuring a plurality of resistances of the circuit wherein each resistance of the plurality of resistances corresponds to a different horizontal location of the first heat source from a plurality of horizontal locations of the first heat source;

fourth instructions for comparing each resistance of the plurality of resistances to identify at least one area of said different areas of the surface that includes at least one circuit defect, said at least one area of said different areas including a plurality of components; and fifth instructions for controlling the robotic system to physically contact a second heat source to only the leads of said plurality of components while simultaneously measuring the resistance of the circuit; and sixth instructions for comparing each resistance of the plurality of resistances that were measured when the second heat source was physically contacting the leads of said plurality of components to identify at least one component of said plurality of components.

26. The computer program product as recited in claim 25, wherein the first heat source and the second heat source are the same.

27. The computer program product as recited in claim 25, wherein the location of the circuit defect is determined from the horizontal location of the first heat source for which the corresponding measured resistance of the circuit is significantly different from the resistance of the circuit as measured at all other horizontal locations of the first heat source.

28. A method for detecting and locating a circuit defect in a circuit, said method comprising the steps of:

moving a first heat source proximate to a surface of said circuit about in a plane parallel to and above said surface of said circuit, said first heat source being proximate to but not contacting said surface;

monitoring a resistance of said circuit while said first heat source is located over each area of a plurality of areas of said circuit, each area of said plurality of areas including a plurality of components;

utilizing said resistances monitored utilizing said first heat source to determine if one area of said plurality of areas includes at least one defective component;

in response to a determination that one area of said plurality of areas includes at least one defective component, placing a second heat source in contact with only the leads of each component of said plurality of components included in said one area of said plurality of areas;

monitoring a resistance of said circuit while said second heat source is in contact with leads of each component of said plurality of components included in said one area of said plurality of areas; and utilizing said resistances monitored utilizing said second heat source to identify said at least one defective component.

29. The method according to claim 28, wherein said first heat source and said second heat source are the same heat source.

30. The method according to claim 28, wherein the step of utilizing said resistances monitored utilizing said first heat source to determine if one area of said plurality of areas includes at least one defective component further comprises the step of determining if one area of said plurality of areas produces a resistance monitored while said first heat source was over said one area of said plurality of areas that is significantly different from a resistance produced while said first heat source was over other areas of said plurality of areas.

31. The method according to claim 30, further comprising the step of identifying said one area of said plurality of areas that produces a resistance that was significantly different from a resistance produced while said first heat source was over other areas of said plurality of areas as an area that includes a defective component.

32. The method according to claim 28, wherein the step of utilizing said resistances monitored utilizing said second heat source to identify said at least one defective component further comprises the step of determining one component of said plurality of components that produces a resistance monitored while said second heat source was in contact with leads of said one component of said plurality of components that is significantly different from a resistance produced while said second heat source was in contact with leads of other components of said plurality of components.

33. The method according to claim 28, wherein said second heat source is a soldering iron tip.

34. The method according to claim 28, wherein said resistance of said circuit is measured with an ohmmeter.

35. The method according to claim 28, wherein said first heat source is placed approximately one half inch above said surface of said circuit.

36. The method according to claim 28, wherein said circuit is not subjected to rapid temperature change.

* * * * *

UNITED STATES PATENT AND TRADEMARK OFFICE
CERTIFICATE OF CORRECTION

PATENT NO. : 6,560,556 B1
DATED : May 6, 2003
INVENTOR(S) : Hopkins et al.

It is certified that error appears in the above-identified patent and that said Letters Patent is hereby corrected as shown below:

Column 7,
Line 48, after "first", delete "beat" and insert -- heat --.

Column 10,
Line 12, after "second", delete "beat" and insert -- heat --.

Signed and Sealed this

Eleventh Day of November, 2003

JAMES E. ROGAN
*Director of the United States Patent and Trademark Office*